United States Patent
Chang et al.

(10) Patent No.: US 7,019,401 B2
(45) Date of Patent: Mar. 28, 2006

(54) MULTI-LAYER SUBSTRATE STRUCTURE FOR REDUCING LAYOUT AREA

(75) Inventors: Hsieh-Chen Chang, Chung Cheng (TW); An-Ling Chi, Tu Chen (TW)

(73) Assignee: Micro-Star Int'l Co., Ltd., Taipei Hsien (TW)

( * ) Notice: Subject to any disclaimer, the term of this patent is extended or adjusted under 35 U.S.C. 154(b) by 154 days.

(21) Appl. No.: 10/815,860

(22) Filed: Apr. 2, 2004

(65) Prior Publication Data
US 2005/0139864 A1 Jun. 30, 2005

(30) Foreign Application Priority Data
Dec. 26, 2003 (TW) ............................... 92136964 A

(51) Int. Cl.
*H01L 23/48* (2006.01)
(52) U.S. Cl. .................. 257/758; 257/275; 438/17; 438/64; 438/67; 438/107; 438/110
(58) Field of Classification Search ................ 257/275; 438/17, 64, 67, 107, 110
See application file for complete search history.

(56) References Cited

U.S. PATENT DOCUMENTS 6,645,790 B1 * 11/2003 Moghe et al. .............. 438/107

* cited by examiner

*Primary Examiner*—Mai-Huong Tran
(74) *Attorney, Agent, or Firm*—Troxell Law Office, PLLC

(57) ABSTRACT

The present invention provides a multi-layer substrate structure for reducing layout area, including a first core layer, a second core layer, and a set of coupled transmission line. The first core layer includes a first surface connected to a power supply layer and a second surface corresponding to the first surface. The second core layer includes a third surface connected to a first grounding layer and a fourth surface corresponding to the third surface. The set of coupled transmission lines includes a plurality of first differential signal lines formed on the second surface with a certain line width and a plurality of second differential signal lines formed on the fourth surface with a line width corresponding to the first differential signal lines. The second surface and the fourth surface are connected to a first dielectric layer making the second surface separated from the fourth surface with an appropriated distance. Moreover, the first differential signal lines and the second differential signal lines are oppositely overlapped with at least a portion of the signal line width.

12 Claims, 5 Drawing Sheets

MULTI-LAYER SUBSTRATE STRUCTURE FOR REDUCING LAYOUT AREA

FIELD OF THE INVENTION

The present invention relates to a multi-layer substrate structure for reducing layout area, in particular to a multi-layer substrate structure forming the differential signal lines as a three-dimension stack layout.

BACKGROUND OF THE INVENTION

For the rapid progress of high technology, especially the mighty changes in the field of micro electrical technology, the electrical related products have been deep embedded in every family and business, becoming the necessary part of the modern life.

Certainly, the more demands of human being, the more functions of electrical elements and the smaller size thereof is required. However, these delicate electrical elements need more concentrated devices to reduce the occupied space, and the problems such as transmission line impedance, the distance between two lines, and the layout rules need to be considered thus causing the circuit layout become more and more difficult.

Please refer to FIG. 1, showing the profile of multi-layer substrate structure in the prior art. The multi-layer substrate 1 includes a first core circuit board 11, a second core circuit board 12, and a differential signal process layer 13 located between the first core circuit board 11 and the second core circuit board 12. On the other side of the first core circuit board 11 is a power supply layer 14, and on the other side of the second core circuit board 12 is a grounding layer 15 corresponding to the power supply layer 14. In general, the differential signal process layer 13 can transmit the non-inverted and inverted data that are totally the same and signed as + and − respectively in the figure through two traces from a differential signal transmitter (not shown in the figure) and finally received by a differential signal receiver (not shown in the figure). Because of the type of differential signal, voltage swing can be largely reduced thus increasing the speed in the circuit and further reducing the amount of power consumption and the effect of Electro-Magnetic-Interference (EMI). Besides, on the power supply layer 14 is a single transmission line layer 16, which is isolated from the power supply layer 14 with a dielectric layer 17 to enable the single transmission line layer 16 to transmit signals. In addition, a third core circuit board 18 is formed on the single transmission line layer 16, and a second grounding layer 19 is formed on the third core circuit board 18. The first grounding layer 15 and the second grounding layer 19 respectively have a circuit layer 21 formed on the other side of the corresponding grounding layers. Moreover, to obtain the effect of anti-solder and to protect the circuits on the circuit layer 21 from any scratches causing short circuit or open circuit, a protection film 22, called Solder mask, are formed on the circuit layer 21.

However, the differential signal process layer 13 of the said multi-layer substrate 1 is a kind of plane structure and must be formed in a pair, so along with the rising of designing complexity and difficulty, incomplete signal transmitting problems such as noise coupling and signal distortion will be occurred in such plane circuit board because of the insufficient board surface area, causing poor layout. Thus how to resolve the aforesaid problems to reduce cost and promote production competitiveness has been of great urgency.

SUMMARY OF THE INVENTION

The primary object of the present invention is to provide a multi-layer substrate structure for reducing layout area by laying out the signal transmission line and the differential signal line in different layers thus saving the design space.

The secondary object of the present invention is to provide a multi-layer substrate structure for reducing layout area, through a three-dimension layout method to reduce noise coupling and signal distortion.

The other object of the present invention is to provide a multi-layer substrate structure for reducing layout area, providing a better layout space to improve the circuit performance.

In order to achieve the aforesaid objects, the present invention provides a multi-layer substrate structure for reducing layout area, including: a first core layer, a second core layer, and a set of coupled transmission lines.

The first core layer includes a first surface and a second surface corresponding to the first surface, and wherein the first surface is connected to a power supply layer.

The second core layer includes a third surface and a fourth surface corresponding to the third surface, and wherein the third surface is connected to a first grounding layer.

The set of coupled transmission lines include a plurality of first differential signal lines formed on the second surface with a certain line width, and a plurality of second differential signal lines formed on the fourth surface with a line width corresponding to the first differential signal lines.

Moreover, a first dielectric layer is connected to the second surface and the fourth surface thus making the second surface separated from the fourth surface with an appropriated distance. Besides, at least a portion of the line width of the first differential signal line is overlapped opposite to that of the second differential signal line.

In order to achieve the aforesaid objects, the present invention further provides another preferred embodiment of a multi-layer substrate structure for reducing layout area, and the structure includes: a first stack structure and a second stack structure.

The first stack structure comprises a first core layer, a second core layer, a first set of coupled transmission lines, and a first dielectric layer. The first core layer includes a first surface connected with a power supply layer and a second surface opposite to the first surface. The second core layer includes a third surface connected with a first grounding layer and a fourth surface opposite to the third surface. The first set of coupled transmission lines includes a plurality of first differential signal lines formed on the second surface with one signal line width and a plurality of second differential signal lines formed on the fourth surface corresponding to the line width of the first differential signal lines. The first dielectric layer is connected to the second face and the fourth face, making a portion of the line width of the first differential signal line be overlapped opposite to that of the second differential signal line. Moreover, the first dielectric layer packs the first set of coupled transmission lines, making the first differential signal lines separated from the second differential signal lines with a certain distance.

The second stack structure comprises a third core layer, a fourth core layer, a second set of coupled transmission lines, and a second dielectric layer. The third core layer includes a fifth surface connected with a power supply layer and a sixth surface opposite to the fifth surface. The fourth core layer includes a seventh surface connected with a second grounding layer and an eighth surface opposite to the seventh surface. The second set of coupled transmission lines includes a plurality of third differential signal lines formed on the sixth surface with one signal line width and a plurality of fourth differential signal lines formed on the fourth surface corresponding to the line width of the third differential signal lines. The second dielectric layer is connected to the sixth surface and the eighth surface, making a portion of the line width of the third differential signal line overlapped opposite to that of the fourth differential signal line. Moreover, the second dielectric layer packs the second set of coupled transmission lines, making the third differential signal lines separated from the fourth differential signal lines with a certain distance.

DETAILED DESCRIPTION OF THE INVENTION

The principle spirit of the present invention is that the differential signal lines are separated as a multi-level stack layout, suitable for the plural coupled or differential signal structure of small size, excess surface devices, and insufficient layout surface thus reducing the problems of noise coupling as well as signal distortion and improving circuit characters.

Matched with corresponding drawings, the preferable embodiments of the invention are presented as following and hope they will benefit your esteemed reviewing committee members in reviewing this patent application favorably.

Figure 1:
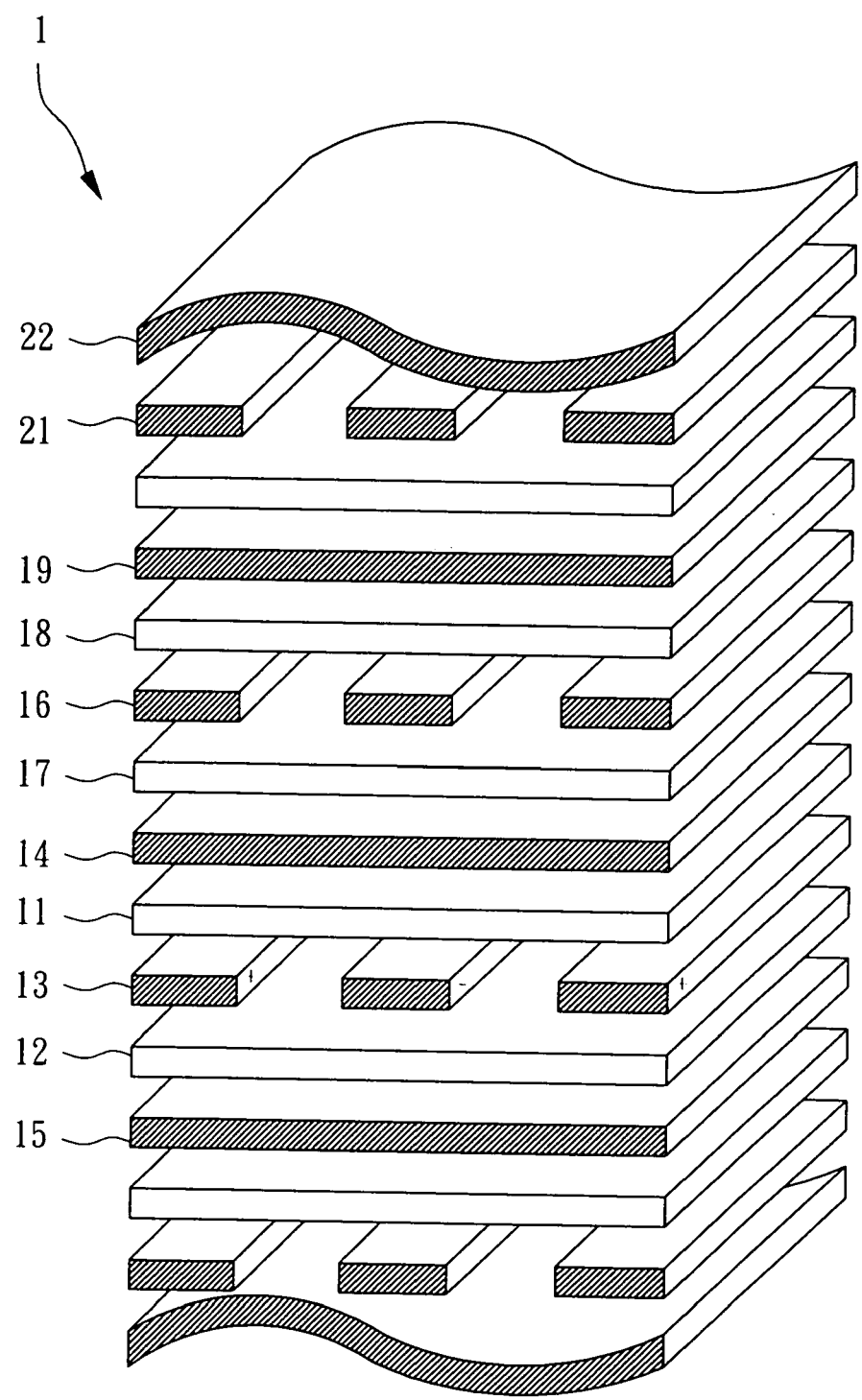
FIG. 1 is the schematic view showing the side profile of the multi-level circuit board stack structure of the prior art.
Figure 2A:
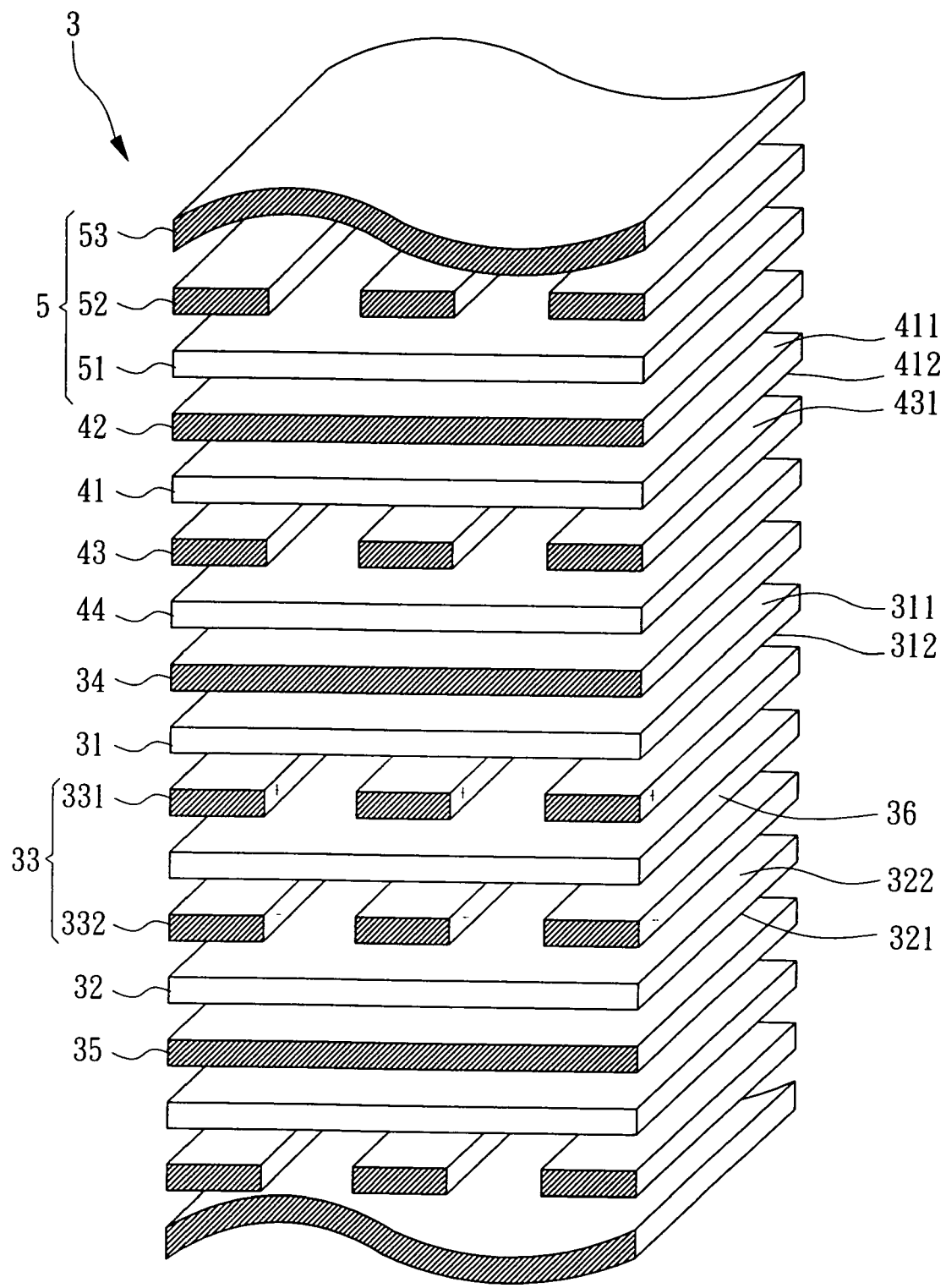
FIG. 2A is the schematic view showing the three-dimension structure of the multi-level circuit board stack structure of the first embodiment in the present invention.
Figure 3:
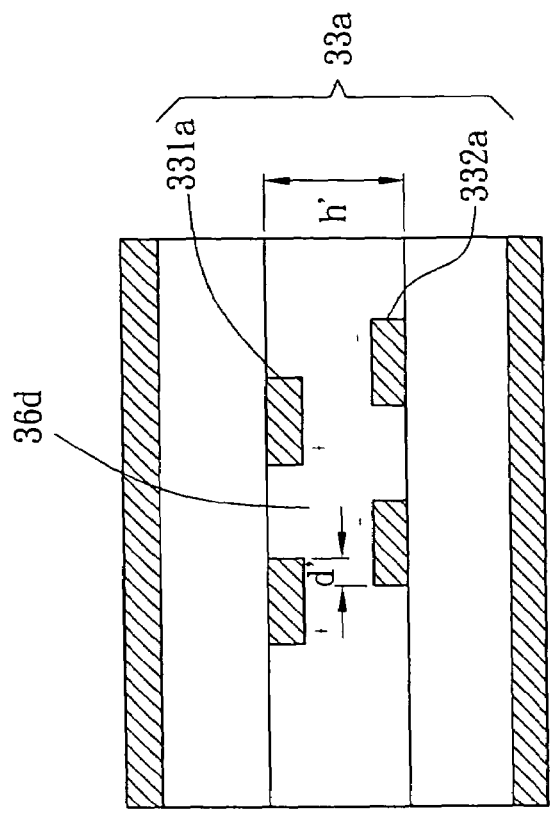
FIG. 3 is the schematic view showing the profile structure of the differential signal process layer of the second embodiment in the present invention.
Figure 2B:
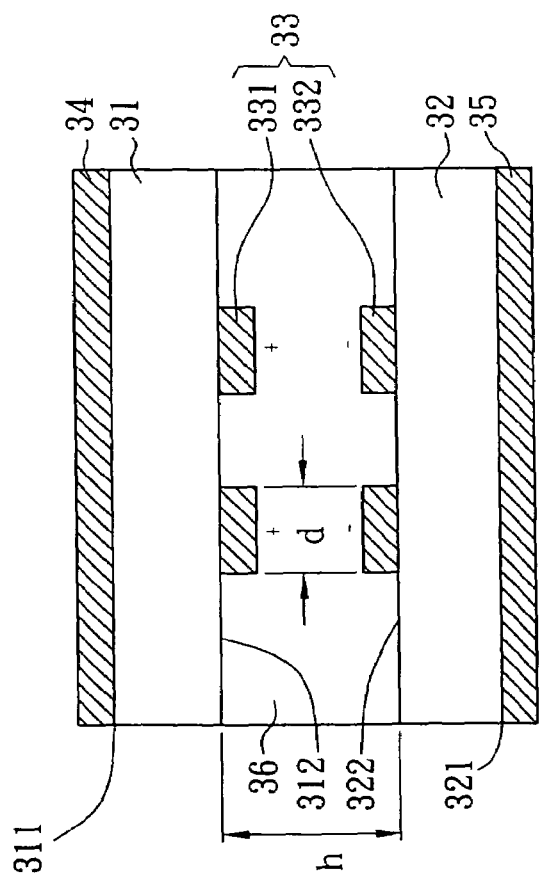
FIG. 2B is the schematic view showing the profile structure of the differential signal process layer of the first embodiment in the present invention.

Please refer to FIG. 2A to FIG. 3, showing several embodiments in three-dimension of the present invention the multi-level circuit board stack structure and the side view of the differential signal process layer thereof. The multi-layer substrate structure for reducing layout area 3 comprises a first core layer 31, a second core layer 32, and a set of coupled transmission lines 33. The first core layer 31 includes a first surface 311 and a second surface 312 opposite to the first surface 311, and the first surface 311 is connected to a power supply layer 34. The second core layer 32 includes a third surface 321 and a fourth surface 322 opposite to the third surface 321, and the third surface 321 is connected to a first grounding layer 35. The set of coupled transmission lines 33 include a plurality of the first differential signal lines 331 formed on the second surface 312 with a line width "d", and a plurality of the second differential signal lines 332 formed on the fourth surface 322 with a line width "d" corresponding to the first differential signal lines 331. Wherein, the power supply layer 34 and the first grounding layer 35 can provide the electric energy for processing differential signals. A first dielectric layer 36 is connected to the second surface 312 and the fourth surface 322, making the second surface 312 separated from the fourth surface with an appropriated distance "h". In this preferred embodiment, the signal line width "d" both of the first differential signal lines 331 and the second differential signal lines 332 are totally superposed. Therefore when the non-inverted and inverted data that are totally the same and signed as + and − respectively in the figure are transmitted through two traces (the first differential signal lines 331 and the second differential signal lines 332) from a differential signal transmitter (not shown in the figure) and finally received by a differential signal receiver (not shown in the figure), the Electro-Magnetic-Interference (EMI) will be counteracted mutually on the layout. In the multi-layer substrate structure for reducing layout area 3, the stack structure of the first differential signal lines 331 and the second differential signal lines 332 can save certain space for the transmission of normal signals thus advantaging the layout design with high complexity and difficulty.

In the following preferred embodiments, the most elements are the same as or similar to those in the aforesaid embodiment, so the identical elements are directly given the same designations and numbers, and the similar elements are given the same designations but added a English character in the rear of the original numbers for distinguishing. In another preferred embodiment, the signal line width d both of the first differential signal lines 331 and the second differential signal lines 332 are overlapped with only the portion d'. Though the non-inverted and inverted data that are totally the same (signed as + and − respectively in the figure) also can be transmitted through two traces (the first differential signal lines 331 and the second differential signal lines 332) from a differential signal transmitter (not shown in the figure) and finally received by a differential signal receiver (not shown in the figure), the impedance of this embodiment needs to be adjusted to shorten the distance between the second surface 312 and the fourth surface 322 from the original h to the shorter h'; that is, the thickness of the first dielectric layer 36ah' is smaller than that of the original dielectric layer 36 h.

The aforesaid multi-level stack structures of circuit board for reducing layout area 3 of the present invention further comprise a third core layer 41, a signal transmission line layer 43, and a second dielectric layer 44. The third core layer 41 includes a fifth surface 411 and a sixth surface 412 opposite to the fifth surface 411, and the fifth surface 411 is connected to a second grounding layer 42. The signal transmission line layer 43 is connected to the sixth surface 412 and further includes a plurality of signal transmission lines 431 with appropriated arrangement. The second dielectric layer 44 is connected to the sixth surface 412 and the power layer 34. Moreover, the second dielectric layer 44 packs the signal transmission line layer 43, making the signal transmission line layer 43 separated from the power supply layer 34 with a distance "s". By such structure, the signal transmission line layer 43 is located between the power supply layer 34 and the second grounding layer 42 thus being able to get the electric energy for processing normal signals. Besides, the most outer layers are all grounding layers at this moment. Finally, on the first grounding layer 35 and the second grounding layer 42 are respectively formed a covering structure 5. This covering structure 5 includes a second dielectric layer 51 connected to the grounding layer, a signal layer 52 printed on the second dielectric layer 51 as a printed circuit layer in normal multi-level circuit boards, and a Solder mask layer 53 covering and connecting to the signal layer 52 to protect the circuits on the signal layer 52 from any scratches causing short circuit or open circuit and get the effect of anti-solder.

Figure 4:
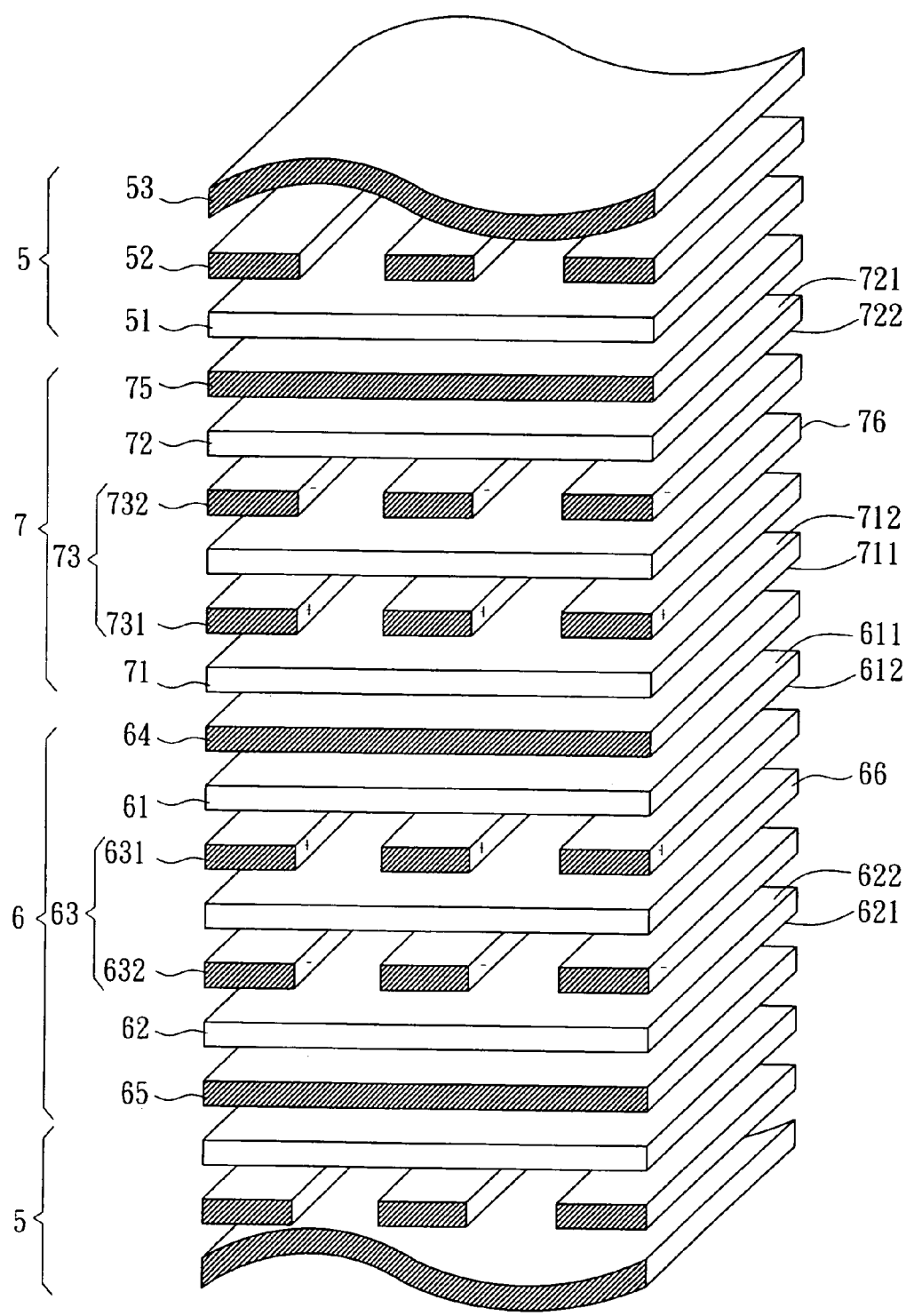
FIG. 4 is the schematic view showing the three-dimension structure of the multi-level circuit board stack structure of the third embodiment in the present invention.

Please refer to FIG. 4, showing another preferred embodiment in three-dimension of the present invention the multi-level circuit board stack structure. In this embodiment, the multi-level circuit board stack structure comprises a first stack structure 6 and a second stack structure 7. The first stack structure 6 further comprises a first core layer 61, a second core layer 62, a first set of coupled transmission lines 63, and a first dielectric layer 66. The first core layer 61 includes a first surface 611 and a second surface 612 opposite to the first surface 611, and is connected to a power supply layer 64. The second core layer 62 includes a third surface 621 and a fourth surface 622 opposite to the third surface 621, and is connected to a first grounding layer 65. The first set of coupled transmission lines 63 includes a plurality of the first differential signal lines 631 formed on the second surface 612 with a line width "d", and a plurality of the second differential signal lines 632 formed on the fourth surface 622 with a line width "d" corresponding to the first differential signal lines 631. Moreover, the first dielectric layer 66 packs the first set of coupled transmission lines 63.

The second stack structure 7 and the first stack structure 6 jointly use the same power supply layer 64, by which the second stack structure 7 can be stacked on the first stack structure 6. The second stack structure 7 includes a third core layer 71, a fourth core layer 72, a second set of coupled transmission lines 73, and a second dielectric layer 76. The third core layer 71 includes a fifth surface 711 connected with the power supply layer 64 and a sixth surface 712 opposite to the fifth surface 711. The fourth core layer 72 includes a seventh surface 721 connected with a second grounding layer 75 and a eighth surface 722 opposite to the seventh surface 721. The second set of coupled transmission lines 73 includes a plurality of the third differential signal lines 731 formed on the sixth surface 712, and a plurality of the fourth differential signal lines 732 formed on the eighth surface 722 corresponding to the third differential signal lines 731. Moreover, the second dielectric layer 7 packs the second set of coupled transmission lines 73, and the power supply layer 64 as well as the second grounding layer 75 provide the electric energy for processing differential signals, when the most outer layers are all grounding layers. Finally, on the first grounding layer 65 and the second grounding layer 75 are respectively formed a covering structure 5. This covering structure 5 includes a second dielectric layer 51 connected to the grounding layer, a signal layer 52 printed on the second dielectric layer 51 as a printed circuit layer in normal multi-level circuit boards, and a Solder mask layer 53 covering and connecting to the signal layer 52 to protect the circuits on the signal layer 52 from any scratches causing short circuit or open circuit and get the effect of anti-solder.

Figure 5B:
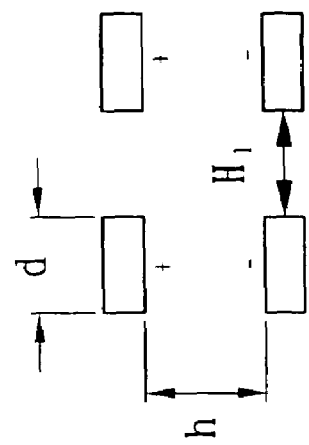
FIG. 5 is the schematic view showing the differential signal process layout area of the prior art.
Figure 5A:
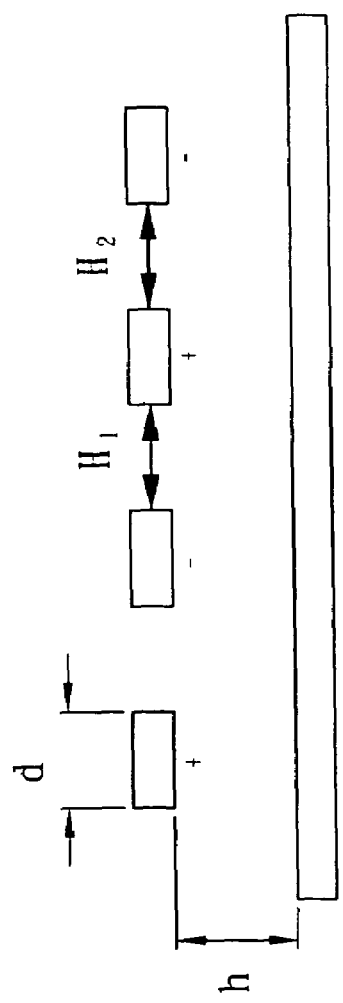

Please refer to FIG. 5A and FIG. 5B, comparing the differential signal process layout area of the prior art versus that of the present invention. In the prior art, the differential signal process layout area is equal to 4*signal line width d+2*distance between the coupled differential signal lines H2+distance between two adjacent sets of the coupled differential signal lines H1. However, in the present invention, the differential signal process layout area is equal to 2*signal line width d+distance between two adjacent sets of the coupled differential signal lines H1. Obviously, the present invention can save the layout area of 2*signal line width d+2*distance between the coupled differential signal lines H2. Moreover, the more sets of the differential signal lines are, the more layout area can be saved, for example in the SCSI card, there are to total 27 differential signals between the SCSI connectors, and thus the shortages of noise coupling as well as signal distortion of the prior art can be overcome by the multi-level stack structure of the present invention.

In summary, from the structural characteristics and detailed disclosure of each embodiment according to the invention, it sufficiently shows that the invention has progressiveness of deep implementation in both objective and function, also has the application value in industry, and it is an application never seen ever in current market and, according to the spirit of patent law, the invention is completely fulfilled the essential requirement of new typed patent.

What is claimed is:

1. A multi-layer substrate structure for reducing layout area, comprising:
  a first core layer, including a first surface connected to a power supply layer and a second surface corresponding to the first surface;
  a second core layer, including a third surface connected to a first grounding layer and a fourth surface corresponding to the third surface; and
  a set of coupled transmission lines, including a plurality of first differential signal lines formed on said second surface with a certain line width and a plurality of second differential signal lines formed on said fourth surface with the line width corresponding to said first differential signal lines;
  wherein, said second surface and said fourth surface are connected to a first dielectric layer making said second surface separated from said fourth surface with a first distance, and said first differential signal lines as well as said second differential signal lines are oppositely overlapped with at least a portion of said signal line width.

2. The multi-layer substrate structure for reducing layout area recited in claim 1, wherein said first dielectric layer packs said set of coupled transmission lines, making said first differential signal lines separated from said second differential signal lines with a second distance.

3. The multi-layer substrate structure for reducing layout area recited in claim 1, wherein said multi-level stack structure further comprises:
  a third core layer, including a fifth surface connected to a second grounding layer and a sixth surface corresponding to said fifth surface;
  a signal transmission line layer, connected to said sixth surface; and
  a second dielectric layer, connected to said sixth surface and said power supply layer.

4. The multi-layer substrate structure for reducing layout area recited in claim 3, wherein said signal transmission line layer further includes a plurality of signal transmission lines with appropriate arrangement.

5. The multi-layer substrate structure for reducing layout area recited in claim 3, wherein said second dielectric layer packs said signal transmission line layer, making said power supply layer separated from said signal transmission line layer with an third distance.

6. The multi-layer substrate structure for reducing layout area recited in claim 3, wherein on said first grounding layer and said second grounding layer are respectively covered with a covering structure, including:
  a second dielectric layer; connected to said grounding layer;

a signal layer, connected to said second dielectric layer; and a Solder mask layer, covering and connecting to said signal layer.

7. A multi-layer substrate structure for reducing layout area, comprising:
- a first stack structure, including:
  - a first core layer, including a first surface connected to a power supply layer and a second surface corresponding to said first surface;
  - a second core layer, including a third surface connected to a first grounding layer and a fourth surface corresponding to said third surface;
  - a first set of coupled transmission lines, including a plurality of first differential signal lines formed on said second surface with a certain line width and a plurality of second differential signal lines formed on said fourth surface with the line width corresponding to said first differential signal lines; and
  - a first dielectric layer, connected to said second surface and said fourth surface to make said first differential signal lines and said second differential signal lines overlapped oppositely with at least a portion of said signal line width, and further packing said first set of coupled transmission lines to make said first differential signal lines and said second differential signal lines apart from a first distance; and
- a second stack structure, including:
  - a third core layer, including a fifth surface connected to said power supply layer and a sixth surface corresponding to said first surface;
  - a fourth core layer, including a seventh surface connected to a second grounding layer and a eighth surface corresponding to said seventh surface;
  - a second set of coupled transmission lines, including a plurality of third differential signal lines formed on said sixth surface with a certain line width and a plurality of fourth differential signal lines formed on said eighth surface with the line width corresponding to said third differential signal lines; and
  - a second dielectric layer, connected to said sixth surface and said eighth surface to make said third differential signal lines and said fourth differential signal lines overlapped oppositely with at least a portion of said signal line width, and further packing said second set of coupled transmission lines to make said third differential signal lines and said fourth differential signal lines apart from a second distance.

8. The multi-layer substrate structure for reducing layout area recited in claim 7, wherein on said first grounding layer and said second grounding layer are respectively covered with a covering structure, including:
- a second dielectric layer, connected to said grounding layers;
- a signal layer, connected to said second dielectric layer; and
- a Solder mask layer, covering and connecting to said signal layer.

9. The multi-layer substrate structure for reducing layout area recited in claim 7, wherein said first stack structure is connected to another second stack structure to make said first grounding layer of said first stack structure combined with the second grounding layer of said another second stack structure, and said another second stack structure is connected to another first stack structure with another power supply layer.

10. The multi-layer substrate structure for reducing layout area recited in claim 9, wherein on said second grounding layer of said second stack structure and the first grounding layer of said another first stack structure are respectively covered with a covering structure, including:
- a second dielectric layer, connected to said grounding layer;
- a signal layer, connected to said second dielectric layer; and
- a Solder mask layer, covering and connecting to said signal layer.

11. The multi-layer substrate structure for reducing layout area recited in claim 7, wherein said second stack structure is connected to another first stack structure to make said second grounding layer of said second stack structure combined with the first grounding layer of said another first stack structure, and said another first stack structure is connected to another second stack structure with another power supply layer.

12. The multi-layer substrate structure for reducing layout area recited in claim 9, wherein on said first grounding layer of said first stack structure and the second grounding layer of said another second stack structure are respectively covered with a covering structure, including:
- a second dielectric layer, connected to said grounding layer;
- a signal layer, connected to said second dielectric layer; and
- a Solder mask layer, covering and connecting to said signal layer.

* * * * *